United States Patent
Vincent et al.

(10) Patent No.: US 9,761,570 B1
(45) Date of Patent: Sep. 12, 2017

(54) ELECTRONIC COMPONENT PACKAGE WITH MULTPLE ELECTRONIC COMPONENTS

(71) Applicant: FREESCALE SEMICONDUCTOR, INC., Austin, TX (US)

(72) Inventors: Michael B. Vincent, Austin, TX (US); Jason R. Wright, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/195,175

(22) Filed: Jun. 28, 2016

(51) Int. Cl.
*H01L 25/00* (2006.01)
*H01L 25/16* (2006.01)
*H01L 23/498* (2006.01)

(52) U.S. Cl.
CPC ........ *H01L 25/50* (2013.01); *H01L 23/49816* (2013.01); *H01L 23/49822* (2013.01); *H01L 25/162* (2013.01)

(58) Field of Classification Search
CPC ............... H01L 25/50; H01L 23/49816; H01L 23/49822
See application file for complete search history.

(56) References Cited

U.S. PATENT DOCUMENTS

| | | | |
|---|---|---|---|
| 7,687,899 B1 * | 3/2010 | Berry | H01L 21/561 257/687 |
| 8,216,918 B2 | 7/2012 | Gong et al. | |
| 8,304,878 B2 | 11/2012 | Appelt | |
| 8,518,746 B2 | 8/2013 | Pagaila et al. | |
| 9,142,502 B2 | 9/2015 | Gong et al. | |
| 2003/0148552 A1 | 8/2003 | Halahan | |
| 2007/0114648 A1 * | 5/2007 | Karnezos | H01L 21/563 257/686 |
| 2009/0146283 A1 | 6/2009 | Chen et al. | |
| 2010/0072634 A1 * | 3/2010 | Ha | H01L 25/105 257/787 |
| 2010/0087034 A1 | 4/2010 | Yoo et al. | |
| 2010/0289126 A1 | 11/2010 | Pagaila et al. | |
| 2011/0068459 A1 | 3/2011 | Pagaila et al. | |
| 2012/0056329 A1 | 3/2012 | Pagaila et al. | |
| 2013/0037936 A1 | 2/2013 | Choi et al. | |
| 2013/0049217 A1 | 2/2013 | Gong et al. | |
| 2013/0154091 A1 * | 6/2013 | Wright | H01L 23/49816 257/738 |
| 2013/0175686 A1 | 7/2013 | Meyer et al. | |
| 2014/0057394 A1 | 2/2014 | Ramasamy et al. | |
| 2014/0159251 A1 | 6/2014 | Marimuthu et al. | |
| 2015/0155240 A1 | 6/2015 | Yao et al. | |
| 2015/0262931 A1 | 9/2015 | Vincent et al. | |

OTHER PUBLICATIONS

Narveson, B., et al., "Significant Developments and Trends in 3D Packaging with Focus on Embedded Substrate Technologies", PSMA Packaging Committee, 2015.

(Continued)

*Primary Examiner* — Errol Fernandes
(74) *Attorney, Agent, or Firm* — David G. Dolezal

(57) ABSTRACT

A method for making an electronic component package from an encapsulated panel. The encapsulated panel includes two packaging substrate assembles including electronic components. Access sides of the electronic components face outward from the encapsulated panel. Standoffs separate the packaging substrate assemblies from each other.

22 Claims, 12 Drawing Sheets

(56) References Cited

OTHER PUBLICATIONS

U.S. Appl. No. 14/939,981, filed Nov. 12, 2015.
Non-final office action dated Oct. 20, 2016 in U.S. Appl. No. 14/939,981.
Final office action dated May 2, 2017 in U.S. Appl. No. 14/939,981.
Notice of Allowance dated Jul. 6, 2017 in U.S. Appl. No. 14/939,981.

* cited by examiner

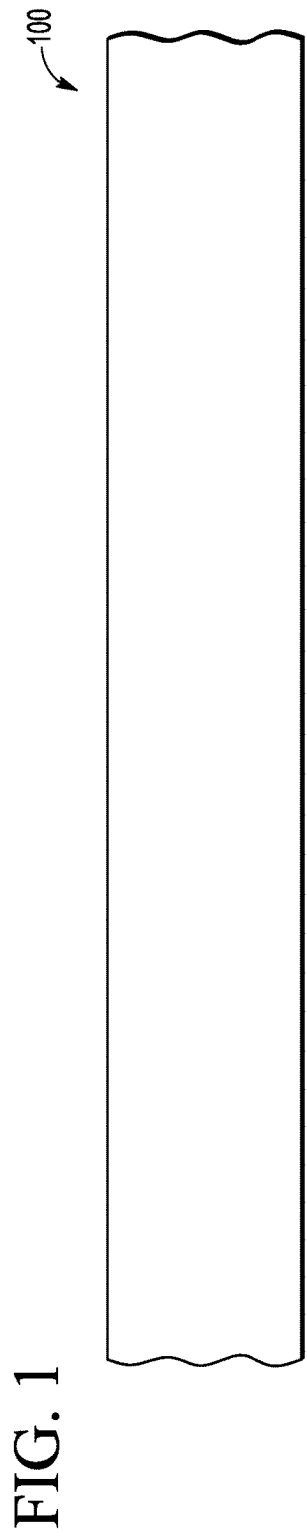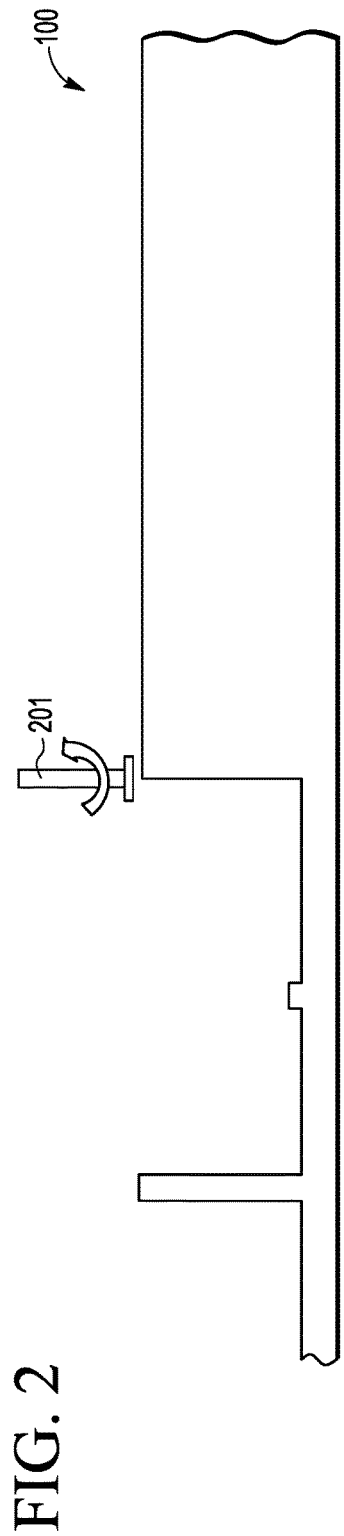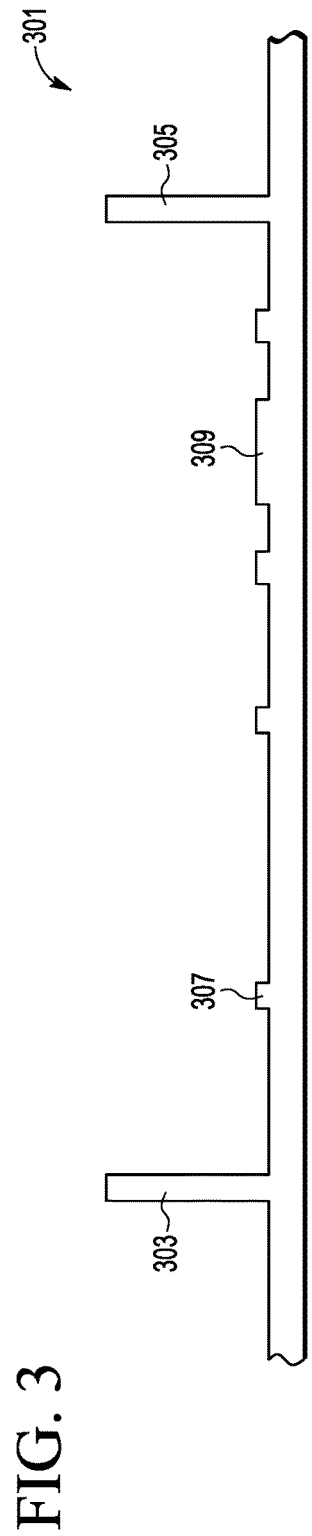

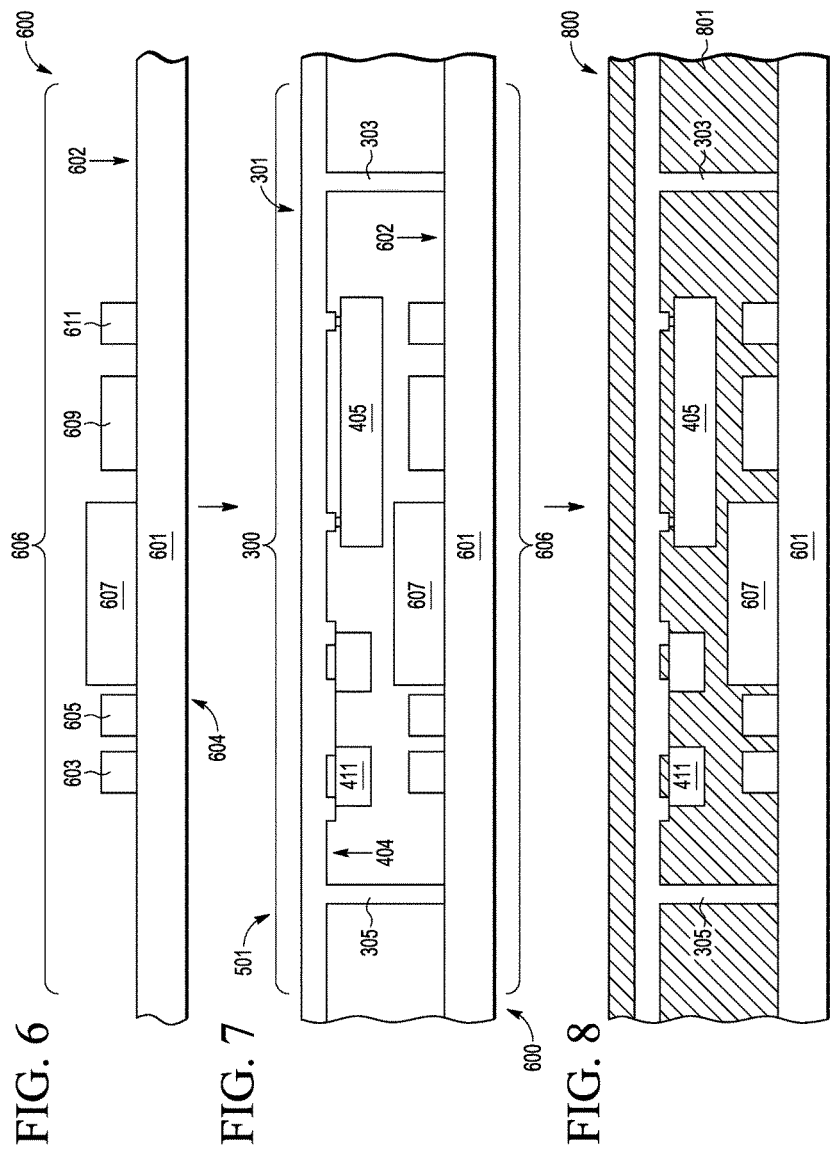

ELECTRONIC COMPONENT PACKAGE WITH MULTPLE ELECTRONIC COMPONENTS

BACKGROUND OF THE INVENTION

Field of the Invention

This invention relates in general to electronic component packages with multiple electronic components.

Description of the Related Art

An electronic component package includes electronic components such as semiconductor die and discrete components (e.g. capacitors, resistors, inductors, antennae) in an encapsulant that allows the components to be utilized in a system (e.g. an electronic system such as a computer, phone, laptop, or other system such as an automobile, appliance, or robotic equipment etc.).

BRIEF DESCRIPTION OF THE DRAWINGS

The present invention may be better understood, and its numerous objects, features, and advantages made apparent to those skilled in the art by referencing the accompanying drawings.

FIGS. 1-3 set forth partial cutaway side views showing the manufacture of a packaging substrate according to one embodiment of the present invention.

FIGS. 4-15 set forth views of various stages in the manufacture of an electronic component package according to one embodiment of the present invention.

The use of the same reference symbols in different drawings indicates identical items unless otherwise noted. The Figures are not necessarily drawn to scale.

DETAILED DESCRIPTION

Figure 4:
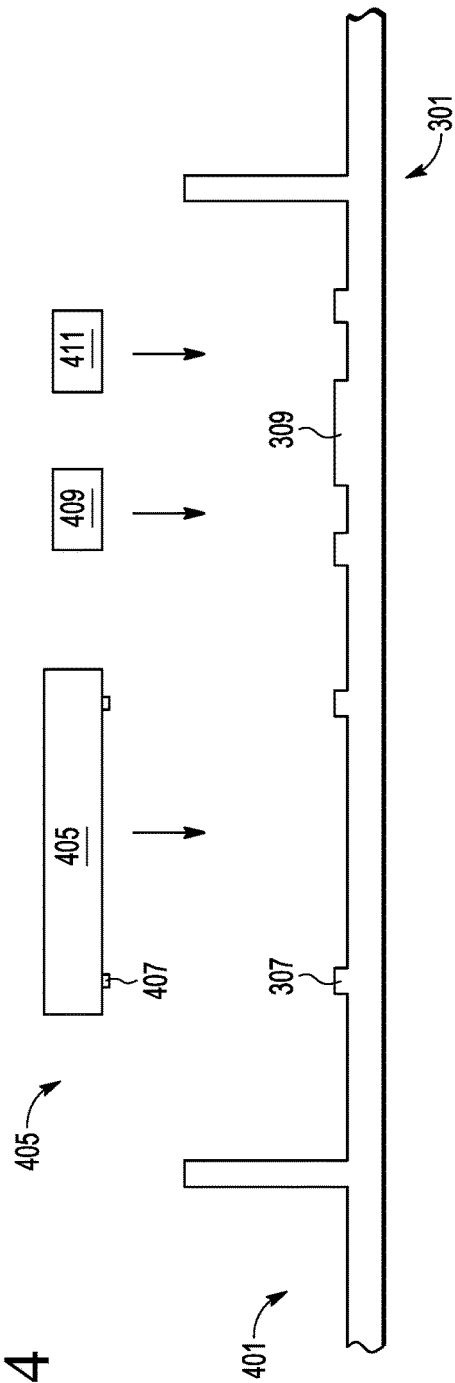

The following sets forth a detailed description of a mode for carrying out the invention. The description is intended to be illustrative of the invention and should not be taken to be limiting.

As disclosed herein, an electronic component package can be formed from attaching electronic components to a packaging substrate to form a packaging substrate assembly and then attaching the packaging substrate assembly to another packaging substrate assembly wherein the packaging substrate assemblies are encapsulated to encapsulate the electronic components in a panel. After the encapsulating, a portion of the packaging substrate can be removed from a major side of the encapsulated panel where a routing layer can be formed on the major side. In some embodiments, a routing layer can be formed on the both major sides of the panel where the electronic components of both packaging substrate assemblies can be electrically coupled together. One advantage that may occur with such a method is that different size electronic components can be encapsulated in a package where the access sides of the components are facing outward from the encapsulated panel and can be accessible by routing layers or electrically conductive structures on both major sides of the encapsulated panel. Thus, with such formed packages, the area of the package can be reduced.

FIGS. 1-3 are partial cutaway side views showing the manufacture of a packaging substrate according to one embodiment of the present invention. In the embodiment shown, the process starts with a slab 100 of conductive material. In one embodiment, the slab is made of copper, but may be made of other materials. In one embodiment, the slab has a thickness in the range of 0.25 mm-1.0 mm but may be of other thicknesses in other embodiments.

FIG. 2 shows a partial cutaway side view of slab 101 as it is being machined to form a packaging substrate. In one embodiment, slab 100 is milled with a face milling cutter 201 that is placed in contact with slab 100 and rotated to remove material according to the desired shape.

FIG. 3 shows a partial cutaway side view of slab 101 after the completion of the milling process to form a packaging substrate 301. Packaging substrate 301 includes a horizontal base support 302 and conductive standoffs (303 and 305) that extend orthogonally from base support 302. In one embodiment, the standoffs (303 and 305) are of the same height as the original thickness of slab 101. Located on base support 302 are pedestals 307 and elongated pedestals 309. In one embodiment, pedestals 307 and 309 have a height above support 302 of 0.05 mm, but may have other heights in other embodiments. Because packaging substrate 301 is machined from a single slab of material, the standoffs, pedestals, and support panel are all integrally coupled together. Although only two standoffs are shown in the view of FIG. 3, other standoffs (not shown) may be located around the pedestals (307 and 309).

FIG. 3 shows one package site 300 of packaging substrate 301. Packaging substrate 301 may also include other package sites located to the right and left of site 300 relative to the view of FIG. 3. Also, packaging substrate 301 may include other sites located into and out from the page of FIG. 3. In other embodiments, a packaging substrate may include only one package site. A packaging substrate may be rectangular and may include an array of N×M package sites where N and M are each ≥1. In other embodiments, packaging substrate 301 may have a non rectangular shape, such as a circular shape, that allows it to be used with wafer level packaging processes.

In other embodiments, packaging substrate 301 can be formed from a slab of material by other ways. For example, in some embodiments, slab 100 can be etched to form the structures of packaging substrate 301. In one example, slab would be etched with two different masks. One mask would be used to form the standoffs 303 and 305 and another to form pedestals 307 and 309. In some embodiments, packaging substrate 301 would not include pedestals (307 and 309).

In another embodiment, packaging substrate 301 could be formed by a molding process where conductive material (e.g. an electrically conductive polymer) would be poured into a mold and cured.

FIG. 4 shows a partial cutaway side view of packaging substrate 301 prior to the attachment of electronic components 405, 409, and 411. Prior to the attachment of the electronic components, an interconnect processing material 401 is applied to the pedestals (307 and 309) of packaging substrate 301. Some examples of interconnect processing material 401 include solder paste, flux, conductive adhesive, or other similar materials. In the embodiment shown, component 405 includes solder bumps 407 that are attached by reflowing. Components 409 and 411 have wrap around leads or pads (not shown) that are attached to the pedestals with a solder fillet. In other embodiments, the electronic components may have other types of external terminals and/or may be attached to the pedestals by different methods. For example, in other embodiments, the bumps of an electronic component (e.g. 405) may be dipped in an interconnect processing material prior to being attached to packaging substrate 301.

Figure 5:
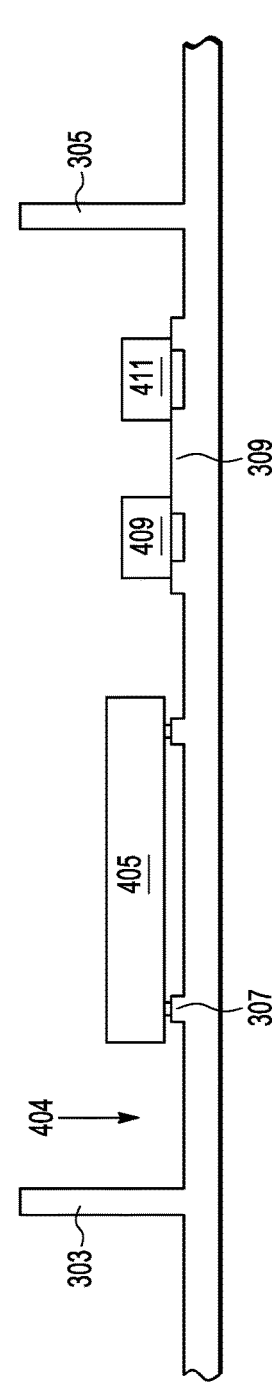

FIG. 5 shows a partial cutaway side view of packaging substrate 301 after the attachment of electronic components (405, 409, and 411) to major side 404 of packaging substrate 301 to form a packaging substrate assembly 501. In one embodiment, electrically conductive structures (e.g. bumps 407, pads, leads; see FIG. 4) on the access sides of the electronic components are brought into contact with pedestals (307 and 309). Packaging substrate 301 and the electronic components are subjected to reflow temperatures or otherwise cured so that the interconnect processing material attaches the conductive structures (e.g. bumps 407) of the electronic components (405, 409, 411) to attach the components to packaging substrate 301. During this time, other electronic components (not shown) would be attached to other package sites (not shown) of packaging substrate 301.

FIG. 6 shows a partial cutaway side view of another packaging substrate assembly 600 having electronic components (603, 605, 607, 609, and 611) attached to a major side 602 of packaging substrate 601 at package site 606. In one embodiment, packaging substrate 601 is a circuit board with conductive traces (not shown) on major side 602, major side 604, and/or embedded in the circuit board. In one embodiment, conductive terminals such as bond pads (not shown) on the access sides of components (603, 605, 607, 609, and 611) are conductively bonded to conductive structures on the top major side 602 of packaging substrate 601 to attach the components to packaging substrate 601. In other embodiments, packaging substrate 601 is not a circuit board but is a slab of material such as a carrier. In such an embodiment, components (603, 605, 607, 609, and 611) are attached in an access side down configuration to packaging substrate 601. Not shown in FIG. 6 are other electronic components attached to other package sites (not shown) of packaging substrate 601. An access side of an electronic component is a side of the component in which the devices of the component are externally, electrically accessible. Typically (although not always) for an integrated circuit, the access side corresponds to the side of the semiconductor substrate from which the semiconductor devices are formed.

FIG. 7 is a partial cutaway side view after packaging substrate assembly 501 is placed in an oriented position with respect to packaging substrate assembly 600 such that packaging substrate assembly 501 resides on packaging substrate assembly 600 and is supported by the standoffs (303 and 305). In the oriented position shown in FIG. 7, major side 602 of packaging substrate 601 faces major side 404 of packaging substrate 301 and package site 300 aligns with package site 606. In one embodiment, an interconnect processing material (not shown) or nonconductive adhesive is applied to either the standoffs (303, 305) or packaging substrate 601 prior to bringing the packaging substrate assemblies together. The interconnect processing material or adhesive is then reflowed or cured to attach the packaging substrate assemblies together. In some embodiments where packaging substrate 601 is a circuit board, the standoffs (303, 305) are electrically attached to conductive structures of the circuit board.

In some embodiments, packaging substrate assembly 501 would include only one package site and packaging substrate assembly 600 would have multiple package sites. In such an embodiment, multiple packaging substrate assemblies 501 would be placed on assembly 600 at the different package sites. In other embodiments, assembly 600 would include only one package site.

FIG. 8 shows a partial cutaway side view of an encapsulated panel 800 that is formed by encapsulating the packaging substrate assemblies 501 and 600 in the oriented position of FIG. 7. In one embodiment, the encapsulant 801 is a polymer material but may be other types of encapsulating materials in other embodiments such as a silica-filled epoxy, a plastic resin, silicone, or urethane. In one embodiment, the encapsulant 801 is applied by a mold transfer process, but may be applied by other processes in other embodiments (e.g. compression molding, printing, or spin application). In the embodiment shown, encapsulant 801 is located on both major sides of packaging substrate 301. Although in other embodiments, encapsulant 801 would not be located on the topside of packaging substrate 301, relative to the view shown in FIG. 8.

Figure 9:
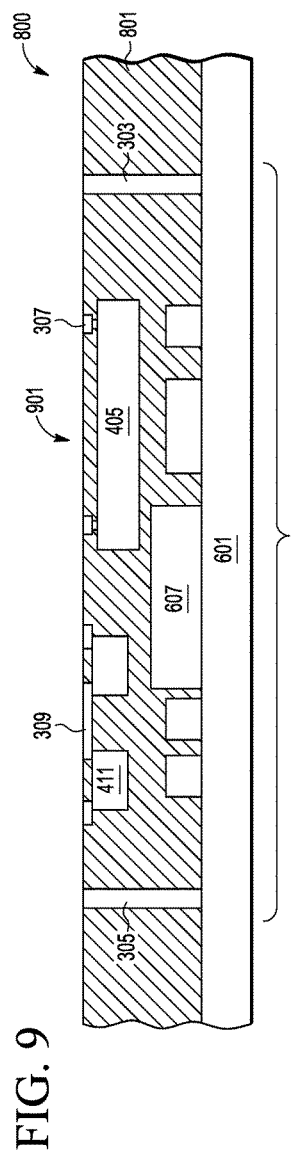

FIG. 9 shows a partial side view of panel 800 after material from major side 901 of panel 800 is removed to expose the conductive pedestals (305, 307). In the embodiment shown, support panel 302 is removed as part of the removal process. In one embodiment, the material of panel 800 is removed by a grinding process. In other embodiments, material would not be removed from major side 901.

For each electronic component shown in FIG. 9, encapsulant 801 is shown located on at least three sides of the electronic component in a direction orthogonal from the side and extending out away from the electronic component from the side. Referring to component 411 as an example, encapsulant 801 is shown as being located on four sides of component 411 in four directions orthogonal from a side and extending out away from component 411 from the side. The four such directions are shown by the four arrows extending orthogonally from the top, bottom, left, and right sides of component 411 (as per the view of FIG. 9). Encapsulant would also be located on the sides going into the page and coming out of the page.

Figure 10:
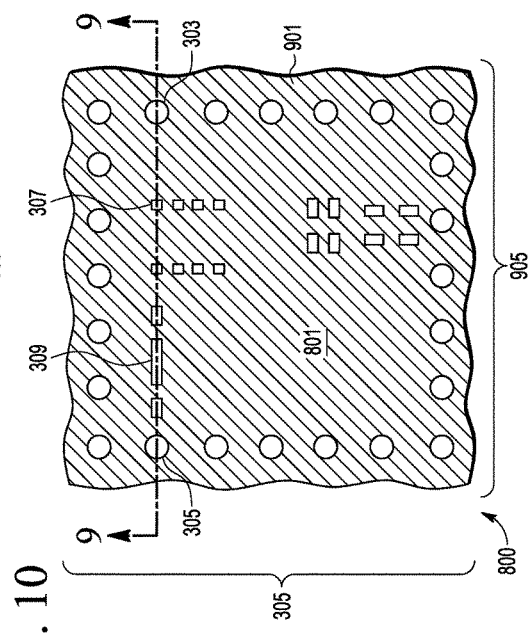

FIG. 10 is a partial top view of panel 800 showing a package site 905 of major side 901 after the removal of support panel 302. In the embodiment of FIG. 10, standoffs (303, 305) surround the perimeter of package site 905. In the embodiment shown, standoffs (303, 305) have a circular cross section, but may have other cross sectional shapes in other embodiments.

Figure 11:
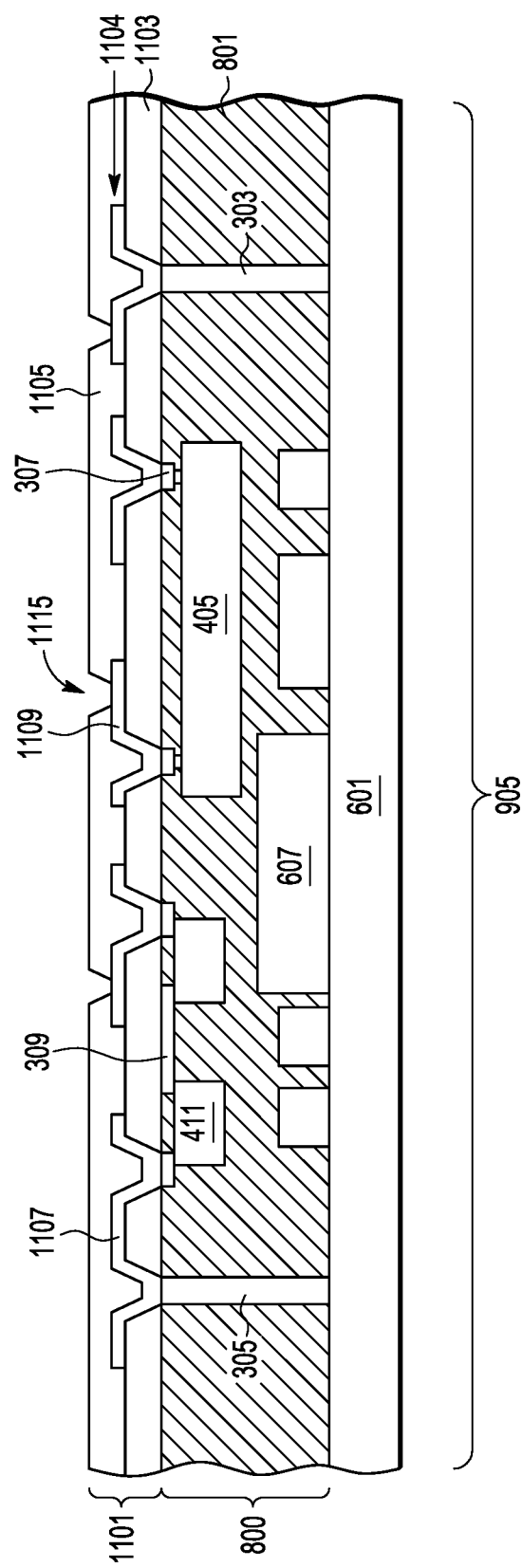

FIG. 11 is a partial cutaway side view of wafer after the formation of a routing layer 1101 on major side 901 of encapsulated panel 800. In the embodiment shown, routing layer 1101 includes a dielectric layer 1103 formed on panel 800. Openings are made to expose the standoffs (303, 305) and conductive pedestals (307 and 309). Afterwards, a layer 1104 of conductive material (e.g. copper) is formed over dielectric layer 1103. The material of layer 1104 electrically contacts the standoffs (303, 305) and pedestals in the openings. Afterwards, layer 1104 is patterned to form electrical interconnects (1109, 1107). In one embodiment, the interconnects of layer 1104 are formed by sputtering a layer of seed material (e.g. copper), where the layer of seed material is patterned to define the locations of the interconnects. The patterned seed layer is then plated to increase the thickness of the conductive material. Electrical interconnect 1107 is electrically coupled to standoff 305 and to electrical component 411. After patterning layer 1104, a dielectric layer 1105 is formed over layer 1104. Openings (1115) are formed in layer 1105 to expose electrical interconnects (1109).

Routing layer 1101 includes only one electrical conductive layer 1104. However, other embodiments may include more. Also, a routing layer may have other structures and configurations, be formed from other materials, and/or have a different number of conductive layers in other embodiments. For example, layer 1104 may have a thickness that completely fills the openings in layer 1103. Also, the electrically conductive interconnects may be made of different materials (e.g. aluminum) and/or formed by different processes in other embodiments.

Figure 12:
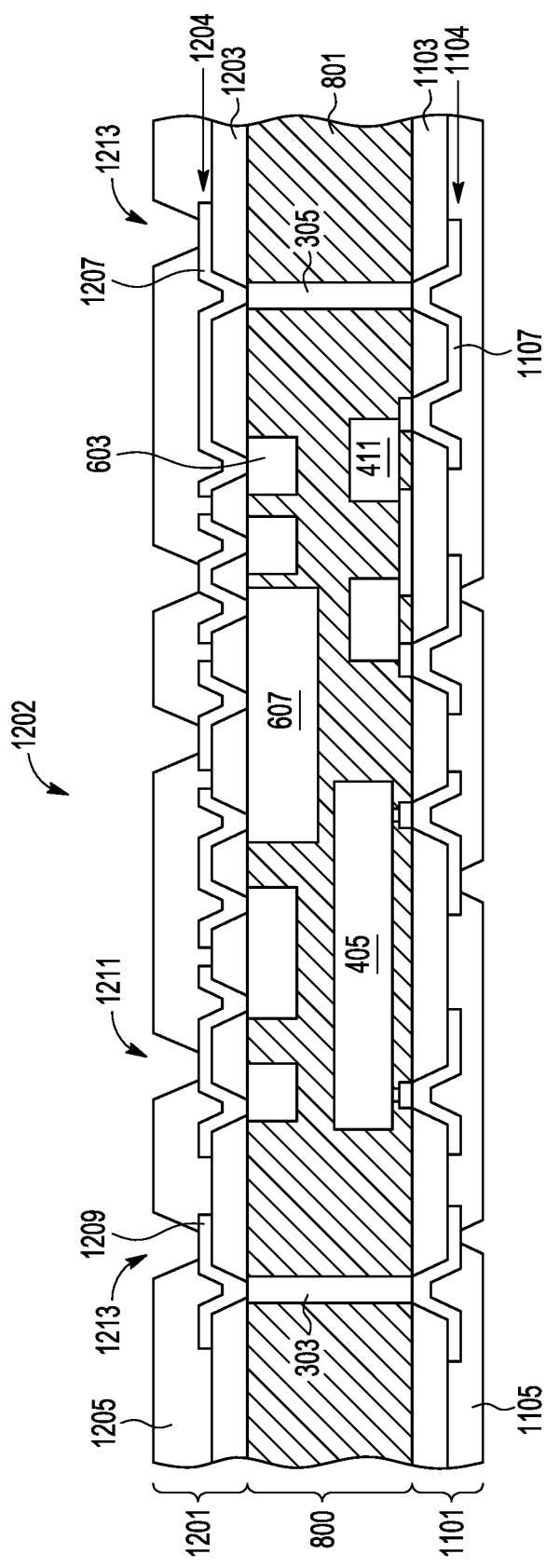

FIG. 12 is a partial cut away side view of panel 800 where packaging substrate 601 has been removed from major side 1202 and routing layer 1201 has been formed thereon. In the embodiment shown, routing layer 1201 is formed in a manner similar to routing layer 1101. Routing layer 1201 includes dielectric layer 1203, conducive layer 1204 and dielectric layer 1205. Layer 1204 has been patterned to form conductive interconnect structures (1207, 1209) that are electrically coupled to standoffs (303, 305) and/or pads of the electronic components (603, 605, 607, 609, and 611) of packaging substrate assembly 600. The interconnects of layer 1204, standoffs (303, 305), and interconnects of layer 1104 electrically couple the components (603, 605, 607, 609, and 611) of packaging substrate assembly 600 to the components (405, 409, and 411) of packaging substrate assembly 501. For example, component 603 is electrically coupled to component 411 by interconnect 1207, standoff 305 and interconnect 1107.

Routing layer 1201 includes only one electrical conductive layer 1204. However, other embodiments may include more. Also, a routing layer may have other structures and configurations, be formed from other materials, and/or have a different number of conductive layers in other embodiments. For example, layer 1204 may have a thickness that completely fills the openings in layer 1203. Also, the electrically conductive interconnects may be made of different materials (e.g. aluminum) and/or formed by different processes in other embodiments. In some embodiments where packaging substrate 601 is a circuit board, routing layer 1201 would not be formed.

Figure 13:
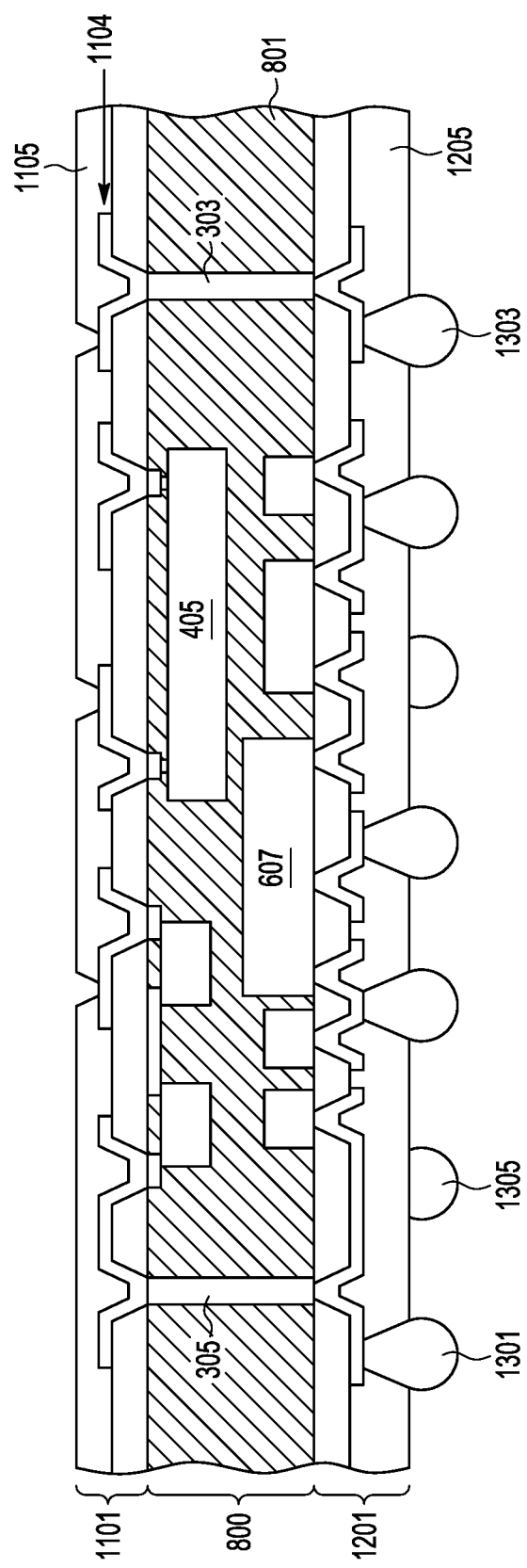

FIG. 13 is a partial cutaway side view of panel 800 where solder balls are attached to conductive structures of layer 1201. In one embodiment, the solder balls are placed in the openings of layer 1205 and then reflowed. In other embodiments, layer 1201 may have other types of external terminals such as leads or pads.

Figure 14:
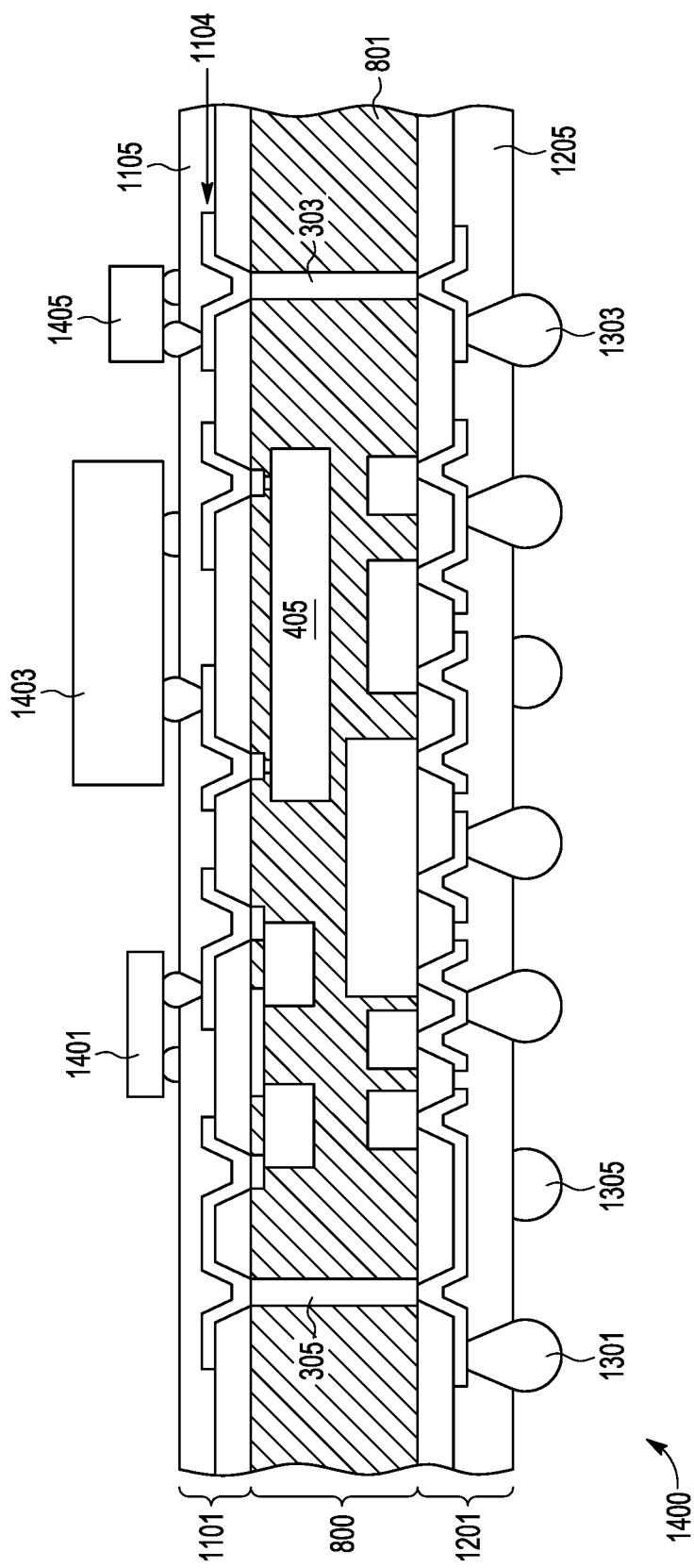

FIG. 14 shows a partial cutaway side view of assembly 1400 where electronic components 1401, 1403 and 1405 are mounted on routing layer 1101. Components 1401, 1403, and 1405 include solder balls that are reflowed to electrically attach the component to conductive interconnects of layer 1104. In some embodiments, dielectric layer 1105 of routing layer 1101 does not include openings such that electrical components are not attached to the topside (relative to the view of FIG. 14) of routing layer 1101.

Figure 15:
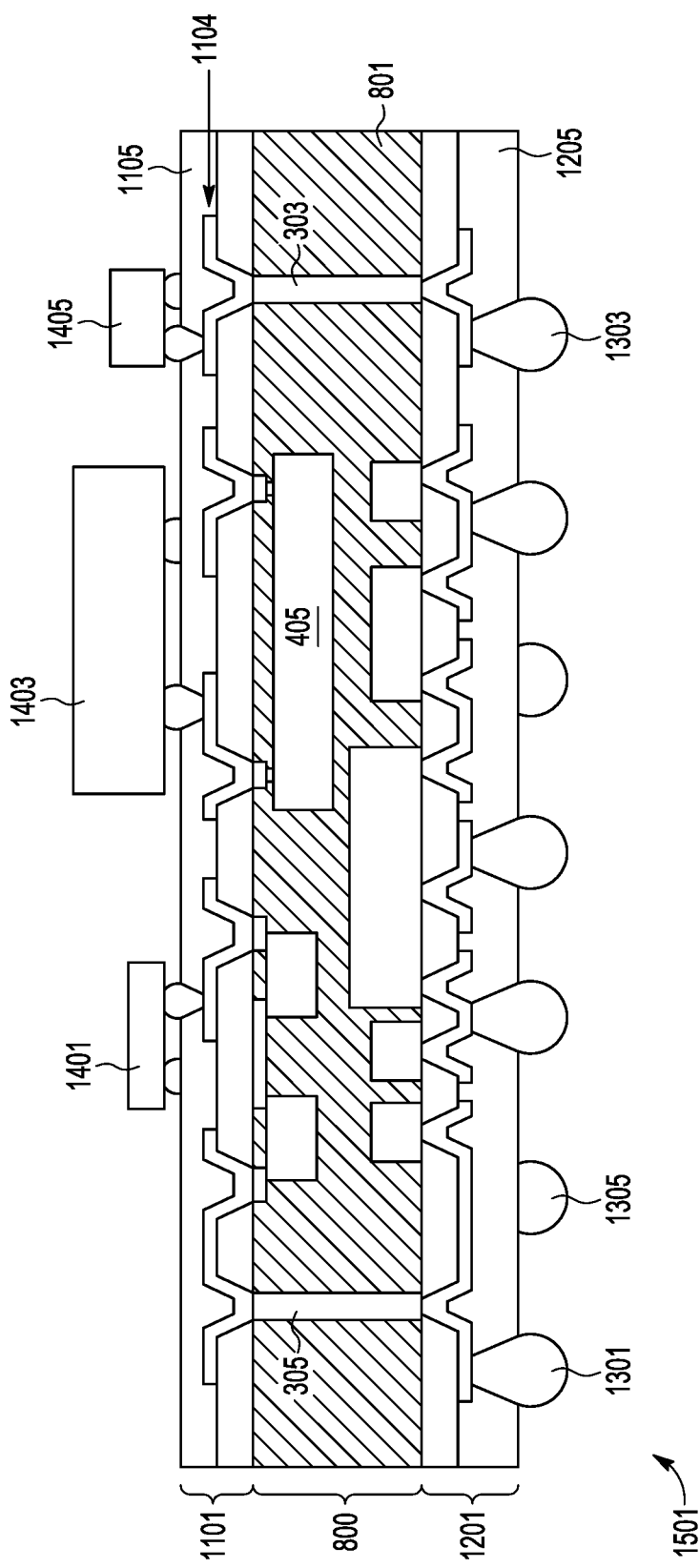

FIG. 15 is a partial cut away side view of electronic component package 1501 after it was singulated from assembly 1400 shown in FIG. 14. Assembly 1400 is cut by a saw, laser, or water jet in some embodiments. In some embodiments, components 1401, 1403, and 1405 are added after singulation.

In one embodiment, package 1501 may include electronic components to implement a data processing system. For example, package 1501 may include a processor, memory, and a power control circuit as well as various standalone components such as resistors, capacitors, inductors, sensors, and antennas. Other electronic components may also be included such as power regulators, power amplifiers, ASICs, batteries, and cameras. Other embodiments may include other types of components and/or other configurations of the components.

As shown in FIG. 15, package 1501 includes electronic components that have their access sides facing outward from encapsulated panel 800 on both major sides of encapsulated panel. Accordingly, the surface area of a package can be reduced in that both the top and both sides of an encapsulated panel (800) can be used for accessing embedded electronic components as opposed to a package with components on just one side. Furthermore, two sets of components (e.g. from assembly 600 and assembly 501) can be encapsulated into one package as opposed to making two packages and stacking the packages together or having to use an embedded routing layer to access the upper set of components.

Figure 16:
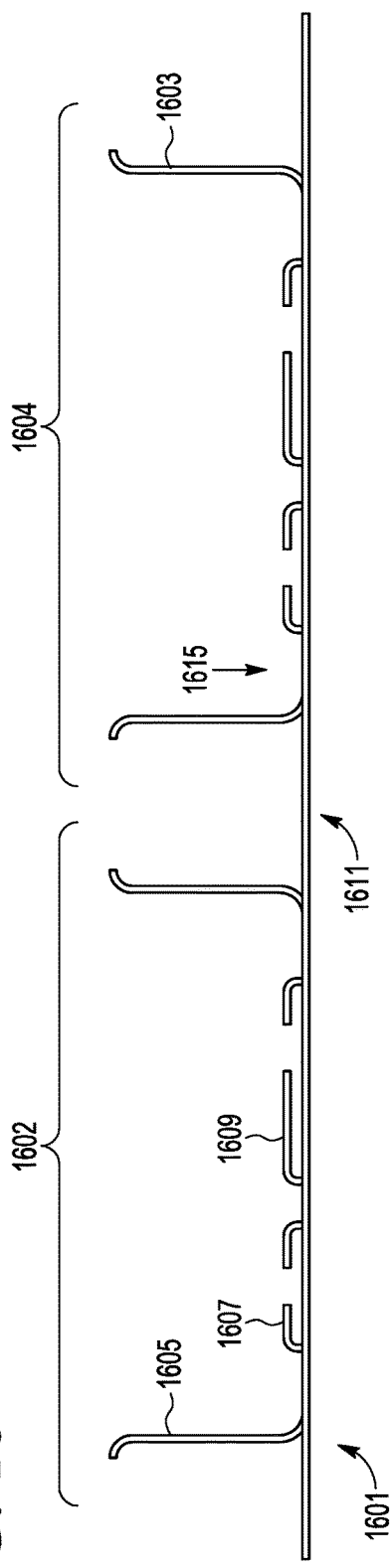
FIGS. 16-19 set forth partial cutaway side views of a packaging substrate according to different embodiments of the present invention.

FIGS. 16-19 set forth partial side cutaway views of alternative embodiments of a packaging substrate that may replace packaging substrate 301 in an electronic component package. FIG. 16 shows a view of packaging substrate 1601 that has standoff structures 1605 and 1603 and pedestals 1607 and 1609 that are formed by stamping and bending a sheet 1611 of conductive material. In the embodiment shown, packaging substrate 1601 includes two package sites 1602 and 1604. Components are mounted to the pedestals (1607 and 1609) on major side 1615 of packaging substrate 1601. In one embodiment, the sheet 1611 of material is made of copper, but may be made of other conductive materials in other embodiments. In one embodiment, after encapsulation, the unbent material of sheet 1611 is removed to reduce the thickness of an encapsulated panel and to add a routing layer (e.g. similar to routing layer 1101).

Figure 17:
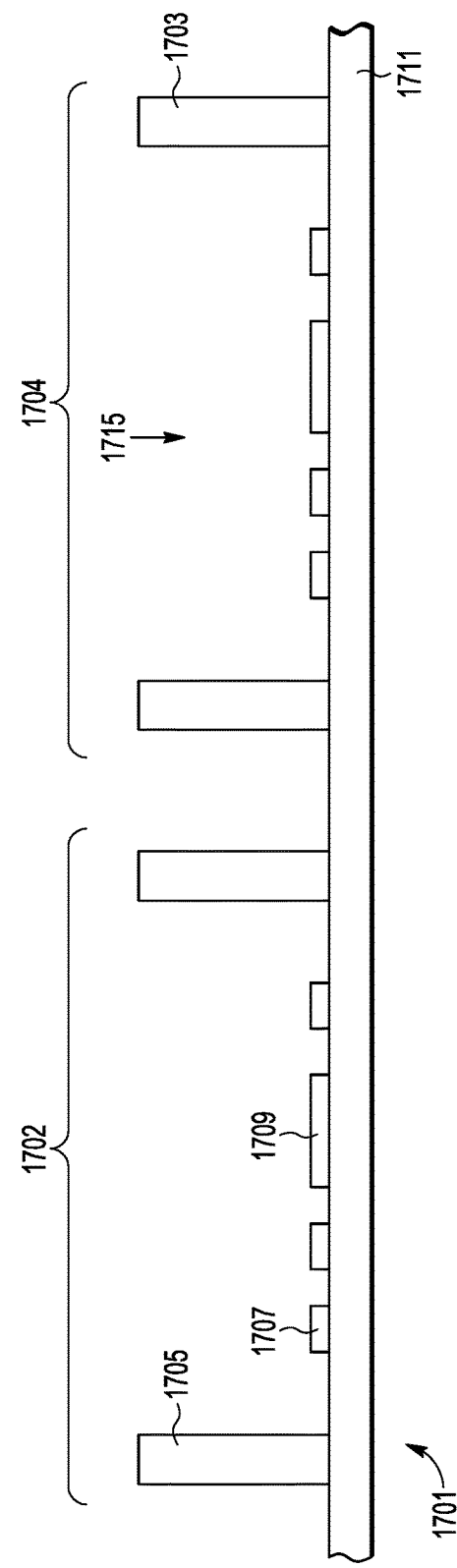

FIG. 17 shows a partial cutaway side view of packaging substrate 1701 that has standoff structures 1705 and 1703 and pedestals 1707 and 1709 that are formed separately from support panel 1711 and attached (e.g. by a pick and place machine) with an adhesive (not shown) prior the attachment of the electronic components. In one embodiment, packaging substrate panel 1711 is made of a material that can be easily removed from the side of a subsequently formed encapsulated panel (e.g. 800). In one example, the panel 1711 is characterized as a carrier and can be removed by applying a releasing agent to release an adhesive (not shown) after encapsulation. The standoffs (1705 and 1703) are made of a conductive material (e.g. copper, aluminum, solder).

Packaging substrate 1701 includes two package sites 1702 and 1704. Components are mounted to the pedestals (1707 and 1709) on major side 1715 of packaging substrate 1701. In one embodiment, support panel 1711 is a printed circuit board which includes conductive structures both on the major sides and embedded in the board for electrically coupling the electronic components and external connectors (e.g. solder balls) of a package. In one such an embodiment where panel 1711 is a circuit board, an additional routing layer (e.g. 1101) would not be formed.

Also in some embodiments of FIG. 17, the pedestals (1707, 1709) would be formed by plating panel 1711 (e.g. with copper) and then subsequently patterning the plated layer. The standoffs (1705, 1703) would be attached to patterned portions of the plated layer. In some embodiments, the pedestals would extend to portions of the packaging substrate where a standoff would be attached to electrically couple the standoff to the pedestal. In some embodiments, pedestals 1707 and 1709 are made of selectively applied solder paste. In some embodiments where packaging substrate 1701 would take the place of packaging substrate 301, the standoffs (1703, 1705) would first be attached to the bottom packaging substrate assembly 600 prior to packaging substrate 1701 being attached to the standoffs when packaging substrate 1701 and packaging substrate assembly 600 are attached.

In one embodiment, the attached standoff structures (1705, 1703) may be implemented in a dielectric ring structure (not shown) that is attached to panel 1711. The ring structure would include an opening that surrounds the pedestals (1707, 1709) of a package site (e.g. 1702). In some embodiments, solder balls may be attached to the top of the standoff structures of the dielectric ring. The solder balls would be used to attach packaging substrate 1701 to a bottom packaging substrate assembly (e.g. 600). In one embodiment, the dielectric ring structure would be integrally formed with the dielectric ring structures for other package sites.

Figure 18:
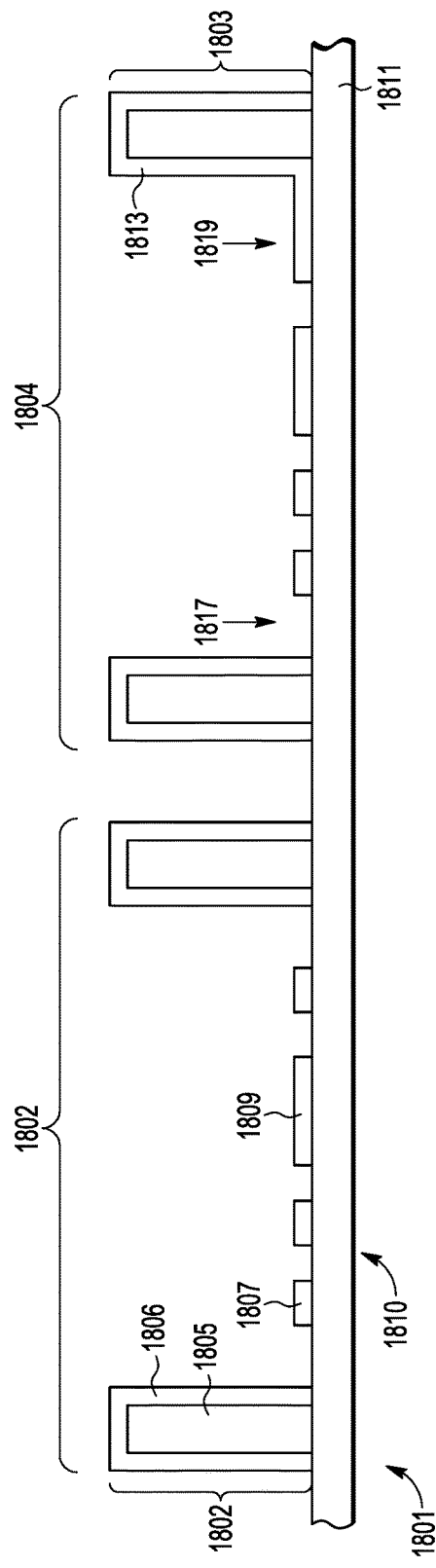

FIG. 18 shows a partial cutaway side view of packaging substrate 1801. Packaging substrate 1801 includes a base structure 1810 that is plated or coated with a conductive material (e.g. copper, solder) which is patterned to form pedestals (1807 and 1809) and the conductive material (1806) of standoffs (1802, 1803). In the embodiment shown, the base structure include flat support panel 1811 and standoff portions (1805). Base structure 1810 can be made of any material that is etch selective with the conductive material of the layer used to make the pedestals and standoff coating conductive material (1806). In one embodiment, base structure 1810 can be formed from a molding process, but may be made by other processes. Packaging substrate 1801 includes two package sites 1802 and 1804. Components are mounted to the pedestals (1807 and 1809) on major side 1817 of packaging substrate 1801.

In the embodiment FIG. 18, pedestal 1819 is integrally connected to the conductive coating 1813 of standoff 1803. With such a feature, an electronic component mounted to pedestal 1819 can be directly, electrically coupled to a standoff without having to go through a routing layer (e.g. 1101). In some embodiments, it may be possible for all electrical paths from the components mounted to major side 1817 to be directly electrically coupled to the conductive coatings (e.g. 1813) of the standoffs (1803) with the patterned conductive pedestals that integrally extend to the conductive coatings of the standoff. Such embodiments may reduce or eliminate the need for such electrical couplings to be made in a routing layer (1101). The packaging substrates of other embodiments shown and described herein (e.g. FIG. 3, FIG. 16, FIG. 17, and FIG. 19) may also include pedestals that extend directly to the conductive standoff material. For example, in some embodiments, pedestal 307 extends to standoff 303. This electrical connection between pedestal 307 and standoff 303 would remain even after the removal of support panel 302 during a grinding process (See FIG. 9). In some such embodiments, solder balls could be mounted directly to the pedestals and/or conductive standoffs.

Figure 19:
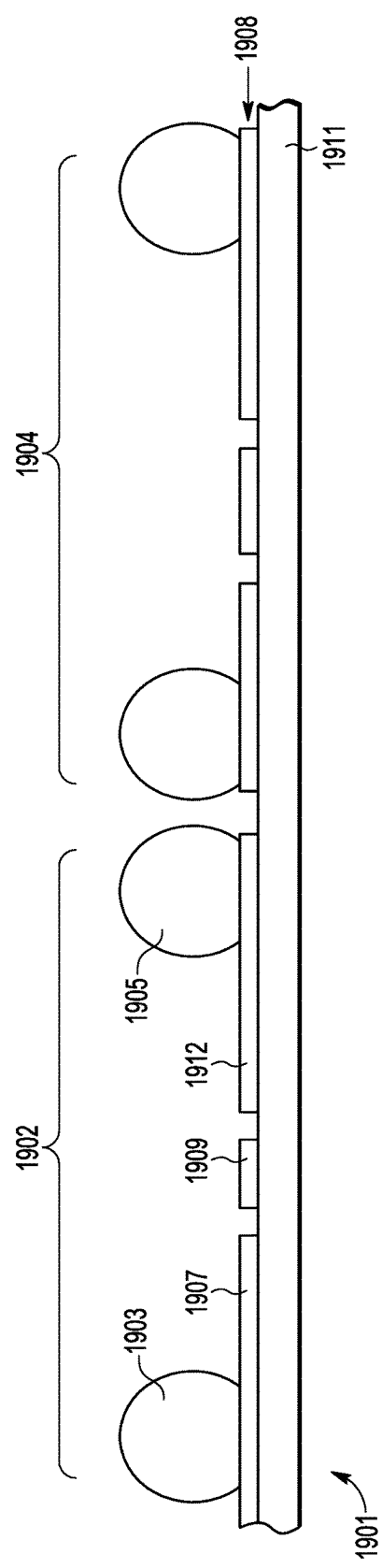

FIG. 19 is a cutaway side view of a packaging substrate 1901 according to another embodiment of the present invention. In this embodiment, solder balls (1903, 1905) serve as standoff structures. As shown in FIG. 19, packaging substrate assembly includes two package sites 1902 and 1904, but other embodiments may include a different number of package sites. Packaging substrate 1901 includes a panel 1911 and a layer 1908 of conductive material (e.g. copper) formed thereon. Layer 1908 has been plated to form pedestals 1907, 1909, and 1912. Electronic components (not shown) will be subsequently attached to the pedestals. In the embodiment shown, solder balls (1903 and 1905) are attached to some of the pedestals (1907 and 1905, respectively) to electrically couple the solder balls to the electronic components (not shown) subsequently attached to the pedestals (1907, 1909, and 1912). Pedestal 1909 will subsequently be attached to two different electronic components. In one embodiment, panel 1911 is characterized as a carrier that will be removed prior to the completion of an electronic component package. However, in other embodiments, panel 1911 is characterized as a circuit board, in which a portion of the circuit board will remain in a subsequently formed electronic component package.

The solder balls (1903, 1905) are attached by placing the solder balls on the pedals and reflowing the packaging substrate. In other embodiments, the solder balls would be reflowed during the attachment of the electronic components (not shown). In some embodiments, the solder balls (1903, 1905) would be directly attached to panel 1911. In such embodiments, the solder balls may be electrically coupled to the electronic components subsequently attached to the pedestals (1907, 1909) by a routing layer (not shown).

In one embodiment, packaging substrate 1901 replaces packaging substrate 301 in an encapsulated panel 800. In such an embodiment, solder balls would contact packaging substrate 601 when packaging substrate 1901 is brought into contact with packaging substrate assembly 600. However, in other embodiments, the solder balls (1903, 1905) could be attached to packaging substrate assembly 600 first and reflowed. Afterwards, packaging substrate 1901 is then brought into contact with the solder balls (1903, 1905) when packaging substrate 1901 is positioned with respect for packaging substrate assembly 600 for encapsulation.

Figure 20:
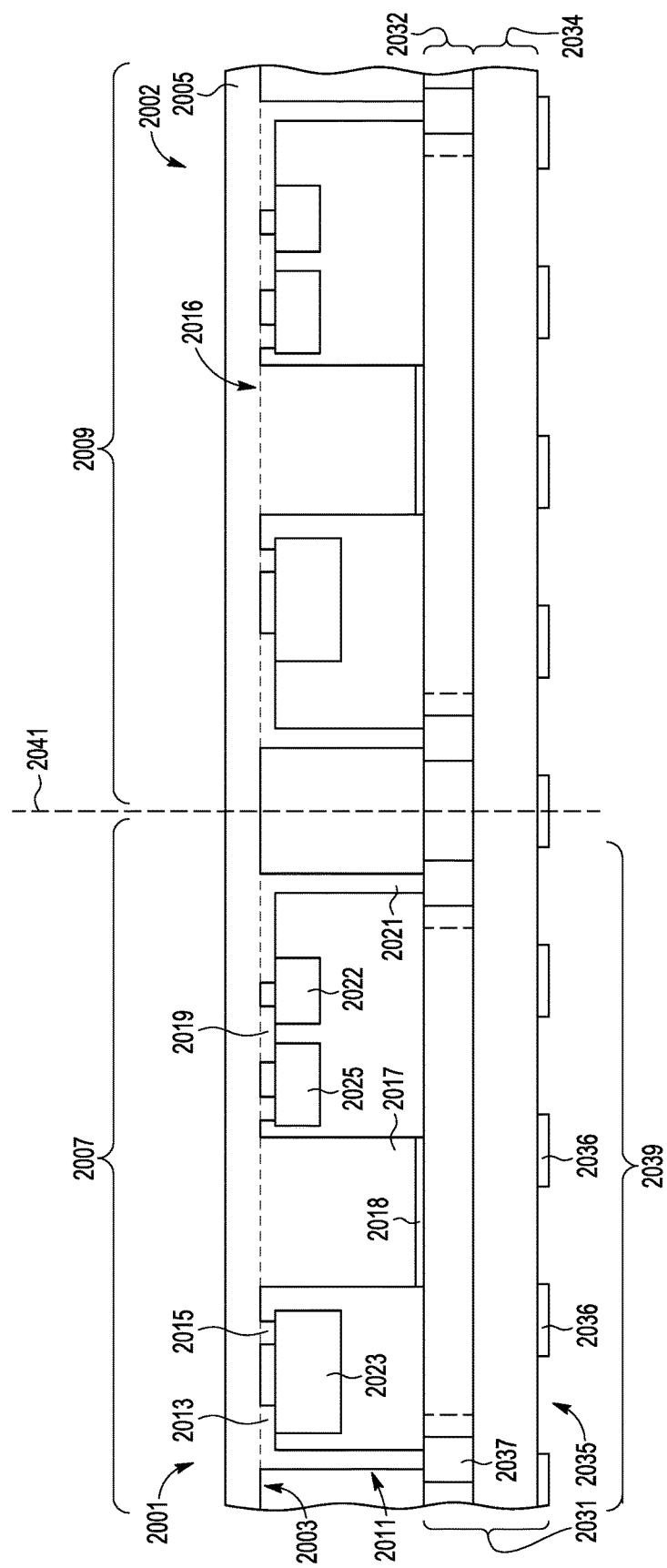
FIG. 20 sets forth a partial cutaway side view of an assembly according to one embodiment of the present invention.

FIG. 20 is a partial cutaway side view of an assembly 2001 that includes two packaging substrate assemblies 2002 and 2031 attached to each other in an oriented position prior to encapsulation. Assembly 2002 includes a packaging substrate 2003 having a support panel 2005, pedestals (2013, 2015, and 2019) and standoffs (2011, 2021), that in the embodiment shown, are integrally formed (e.g. similar to the embodiments described with respect to FIG. 3). Electrical components (2023, 2025, and 2027) are electrically attached to the pedestals (2013, 2015, and 2019) of packaging substrate 2003.

In the embodiment shown, the standoffs (e.g. 2011) are integrally connected to pedestals (e.g. 2013) to electrically couple the electronic components (e.g. 2023) to the standoffs (e.g. 2011). FIG. 20 shows a dashed line 2016 that delineates the portion of packaging substrate 2003 that will be removed (e.g. by a grinding process) from a subsequently formed encapsulated panel (800) formed from assembly 2001. See FIG. 9. As shown in FIG. 20, the connections from the pedestals (e.g. 2013) to the standoffs (e.g. 2011) remain after the removal of support panel 2005 of assembly 2002 from a subsequently formed encapsulated panel.

Packaging substrate assembly 2031 is a processed semiconductor wafer that includes a semiconductor substrate 2032, an interconnect layer 2034, and a solder mask 2036. Mask 2036 includes openings (2035) to expose conductive pads (not shown) of interconnect layer 2034. Semiconductor substrate 2032 is made of a semiconductor material (e.g. silicon, SiGe, GaAs, or GaN) in which transistors and other semiconductor devices have been formed therein.

Assembly 2031 includes an interconnect layer 2034 that includes one or more layers of conductive interconnects and vias (not shown) separated by dielectric material for electrically coupling the semiconductor devices of semiconductor substrate 2032 together. Semiconductor substrate 2032 includes conductive through vias (2037) that extend through the semiconductor substrate 2032 to conductive interconnects (not shown) of interconnect layer 2034. The standoffs (2011) are electrically attached to the conductive through vias 2037, e.g. with conductive adhesive, to attach assembly 2002 to assembly 2031.

In the embodiment shown, assembly (wafer) 2031 includes a number of electronic components (2039) that include semiconductor devices formed in semiconductor substrate 2032 and conductive interconnect structures formed in layer 2034. In one embodiment, electronic component 2039 includes a microprocessor.

In the embodiment shown, packaging substrate 2003 includes heat sinks (2017) that are attached to semiconductor substrate 2032 with thermally conductive adhesive 2018. In the embodiment shown, heat sink 2017 is integrally formed with packaging substrate 2003. In one embodiment, a subsequently formed routing layer (e.g. 1101) on the packaging substrate assembly 2002 side of a resultant encapsulated panel would include thermally conductive material (not shown) that would contact heatsink 2017. In another embodiment, the routing layer would include an opening to expose heatsink 2017 to allow heat to escape. In one embodiment, heat sink 2017 is attached to an area of component 2039 that generates a lot of heat during operation (such as a processor core area).

In other embodiments, a heat sink could be formed separately and attached to a support panel of a packaging substrate of a packaging substrate assembly. See for example, the embodiments of FIGS. 17 and 19 wherein a heat sink could be attached to packaging substrate panels 1711 and 1911, respectively.

In subsequent processes, assembly 2001 is encapsulated. Routing layers may be formed on one or both major sides. Solder balls or other electrical terminals can be attached to one or both major sides. Afterwards, assembly 2001 would be singulated into individual electronic component packages (e.g. singulated along dashed line 2041).

In one embodiment, a method of making an electronic component package includes forming a first packaging substrate assembly. The forming the first packaging substrate assembly includes attaching a first set of at least one electronic component to a first major side of a first packaging substrate. Each electronic component of the first set includes an access side that faces the first major side as a result of the attaching. The method includes after the attaching, positioning the first packaging substrate assembly with respect to a second packaging substrate assembly in an oriented position. In the oriented position, the first major side faces towards the second packaging substrate assembly. The second packaging substrate assembly includes a second set of at least one electronic component having an access side. In the oriented position, the access sides of each electronic component of the second set face in a direction orthogonal from and away from the first major side. The method includes after the positioning, forming an encapsulated panel that includes the first set and the second set. In the encapsulated panel, the first packaging substrate assembly and the second packaging substrate assembly are in the oriented position. For each electronic component of the first set, for at least two sides of the electronic component, encapsulant of the encapsulated panel is located next to the side in a direction orthogonal from the side and extending out away from the electronic component from the side. The method includes forming an electronic component package from the encapsulated panel, wherein the electronic component package includes at least one electronic component from the first set and at least one electronic component from the second set.

In another embodiment, a method of making an electronic component package includes attaching a first set of at least one electronic component to a first major side of a first packaging substrate. The method includes attaching at a second set of at least one electronic component to a first major side of a second packaging substrate. The method includes after the attaching and after the attaching, positioning the first packaging substrate with respect to the second packaging substrate in an oriented position such that the first major side of the first packaging substrate is facing the first major side of the second packaging substrate. In the oriented position, a plurality of standoff structures separates the first packaging substrate from the second packaging substrate. Each of the plurality of standoff structures includes conductive material. The method includes after the positioning, forming an encapsulated panel that includes the first set, the second set, and the plurality of standoff structures. In the encapsulated panel, the first packaging substrate and the second packaging substrate are in the oriented position. For each electronic component of the first set and each electronic component of the second set, for at least two sides of the electronic component, encapsulant of the encapsulated panel is located next to the side in a direction orthogonal from the side and extending out away from the electronic component from the side. The method further includes forming an electronic component package from the encapsulated panel. The electronic component package includes at least one electronic component from the first set, at least one electronic component from the second set, and at least one standoff structure of the plurality of standoff structures.

Features shown or describe with respect to one embodiment set forth herein may be implemented in other embodiments shown or described herein. While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method of making an electronic component package, the method comprising:
   forming a first packaging substrate assembly, the forming the first packaging substrate assembly includes attaching a first set of at least one electronic component to a first major side of a first packaging substrate, wherein each electronic component of the first set includes an access side that faces the first major side as a result of the attaching;
   after the attaching, positioning the first packaging substrate assembly with respect to a second packaging substrate assembly in an oriented position, wherein in the oriented position, the first major side faces towards the second packaging substrate assembly, wherein the second packaging substrate assembly includes a second set of at least one electronic component having an access side, wherein in the oriented position, the access sides of each electronic component of the second set face in a direction orthogonal from and away from the first major side;
   after the positioning, forming an encapsulated panel that includes the first set and the second set, wherein in the encapsulated panel, the first packaging substrate assembly and the second packaging substrate assembly are in the oriented position, for each electronic component of the first set, for at least two sides of the electronic component, encapsulant of the encapsulated panel is located next to the side in a direction orthogonal from the side and extending out away from the electronic component from the side;

forming an electronic component package from the encapsulated panel, wherein the electronic component package includes at least one electronic component from the first set and at least one electronic component from the second set;

wherein the first packaging substrate includes a support panel, wherein the method comprises:

removing at least a substantial majority of the support panel from the encapsulated panel after the forming the encapsulated panel.

2. The method of claim 1, wherein the removing includes removing the at least a substantial majority from a first major side of the encapsulated panel, wherein after the removing, forming a routing layer at the first major side of the encapsulated panel, wherein the routing layer includes a plurality of electrically conductive structures, wherein an electronic component of the first set is electrically coupled to an electrically conductive structure of the plurality of electrically conductive structures of the routing layer and an electronic component of the second set is electrically coupled to an electrically conductive structure of the plurality of electrically conductive structures.

3. The method of claim 1, wherein the first packaging substrate assembly includes a plurality of standoff structures located on the first major side of the first packaging substrate and extending orthogonal from the first major side of the first packaging substrate to the second packaging substrate assembly in the oriented position, wherein each of the plurality of standoff structures includes conductive material, wherein the encapsulated panel includes the plurality of standoff structures.

4. The method of claim 3 wherein the plurality of standoff structures are formed separately from the first packaging substrate and then subsequently attached to first packaging substrate prior to the encapsulated panel.

5. The method of claim 1 wherein the first packaging substrate, the plurality of conductive pedestals, and the plurality of standoff structures are formed by applying a layer of the conductive material to a base structure, the base structure being of a different material than the conductive material.

6. The method of claim 1 wherein after the forming the encapsulated panel, the encapsulated panel includes a plurality of standoff structures located between the first packaging substrate assembly and the second packaging substrate assembly, wherein each of the plurality of standoff structures includes conductive material, wherein the electronic component package includes an electronic component of the first set that is electrically coupled to an electronic component of the second set through conductive material of a standoff structure of the plurality of standoff structures.

7. The method of claim 6 wherein in the oriented position, the first packaging substrate assembly and the second packaging substrate assembly are placed in parallel positions and separated by the plurality of standoff structures.

8. The method of claim 6 wherein in the oriented position prior to the forming an encapsulated panel, the first packaging substrate assembly is supported on the second packaging substrate assembly by the plurality of standoff structures.

9. The method of claim 6 wherein each of the plurality of standoff structures includes a solder ball.

10. The method of claim 1 wherein the first packaging substrate includes a plurality of conductive pedestals located on the first major side, wherein an electronic component of the first set is electrically attached to a conductive pedestal of the plurality of conductive pedestals.

11. The method of claim 1 wherein forming the electronic component package includes singulating the encapsulated panel into a plurality of encapsulated portions for a plurality of electronic component packages including the electronic component package.

12. A method of making an electronic component package, the method comprising:

forming a first packaging substrate assembly, the forming the first packaging substrate assembly includes attaching a first set of at least one electronic component to a first major side of a first packaging substrate, wherein each electronic component of the first set includes an access side that faces the first major side as a result of the attaching;

after the attaching, positioning the first packaging substrate assembly with respect to a second packaging substrate assembly in an oriented position, wherein in the oriented position, the first major side faces towards the second packaging substrate assembly, wherein the second packaging substrate assembly includes a second set of at least one electronic component having an access side, wherein in the oriented position, the access sides of each electronic component of the second set face in a direction orthogonal from and away from the first major side;

after the positioning, forming an encapsulated panel that includes the first set and the second set, wherein in the encapsulated panel, the first packaging substrate assembly and the second packaging substrate assembly are in the oriented position, for each electronic component of the first set, for at least two sides of the electronic component, encapsulant of the encapsulated panel is located next to the side in a direction orthogonal from the side and extending out away from the electronic component from the side;

forming an electronic component package from the encapsulated panel, wherein the electronic component package includes at least one electronic component from the first set and at least one electronic component from the second set;

wherein the first packaging substrate assembly includes a plurality of standoff structures located on the first major side of the first packaging substrate and extending orthogonal from the first major side of the first packaging substrate to the second packaging substrate assembly in the oriented position, wherein each of the plurality of standoff structures includes conductive material, wherein the encapsulated panel includes the plurality of standoff structures;

wherein at least a portion of each standoff structure of the plurality of standoff structures is integrally formed with the first packaging substrate.

13. The method of claim 12, wherein the first packaging substrate includes a support panel, wherein the method comprises:

removing at least a substantial majority of the support panel from the encapsulated panel after the forming the encapsulated panel.

14. The method of claim 12 wherein the first packaging substrate and the plurality of standoff structures are machined from a slab of conductive material.

15. The method of claim 12 wherein the first packaging substrate and the plurality of standoff structures are formed from a sheet of conductive material.

16. A method of making an electronic component package, the method comprising:
   forming a first packaging substrate assembly, the forming the first packaging substrate assembly includes attaching a first set of at least one electronic component to a first major side of a first packaging substrate, wherein each electronic component of the first set includes an access side that faces the first major side as a result of the attaching;
   after the attaching, positioning the first packaging substrate assembly with respect to a second packaging substrate assembly in an oriented position, wherein in the oriented position, the first major side faces towards the second packaging substrate assembly, wherein the second packaging substrate assembly includes a second set of at least one electronic component having an access side, wherein in the oriented position, the access sides of each electronic component of the second set face in a direction orthogonal from and away from the first major side;
   after the positioning, forming an encapsulated panel that includes the first set and the second set, wherein in the encapsulated panel, the first packaging substrate assembly and the second packaging substrate assembly are in the oriented position, for each electronic component of the first set, for at least two sides of the electronic component, encapsulant of the encapsulated panel is located next to the side in a direction orthogonal from the side and extending out away from the electronic component from the side;
   forming an electronic component package from the encapsulated panel, wherein the electronic component package includes at least one electronic component from the first set and at least one electronic component from the second set;
   wherein:
      after the forming the encapsulated panel, the encapsulated panel includes a plurality of standoff structures located between the first packaging substrate assembly and the second packaging substrate assembly, each of the plurality of standoff structures includes conductive material;
      the first packaging substrate includes a plurality of conductive pedestals located on the first major side, an electronic component of the first set is electrically attached to a pedestal of the plurality of conductive pedestals;
      after the forming the encapsulated panel, the pedestal extends to and is electrically connected to conductive material of a standoff structure of the plurality of standoff structures;
      the electronic component package includes the electronic component, the conductive material of the standoff structure, and the pedestal, the pedestal providing an electrically conductive path from the electronic component to the conductive material of the standoff structure.

17. A method of making an electronic component package, the method comprising:
   forming a first packaging substrate assembly, the forming the first packaging substrate assembly includes attaching a first set of at least one electronic component to a first major side of a first packaging substrate, wherein each electronic component of the first set includes an access side that faces the first major side as a result of the attaching;
   after the attaching, positioning the first packaging substrate assembly with respect to a second packaging substrate assembly in an oriented position, wherein in the oriented position, the first major side faces towards the second packaging substrate assembly, wherein the second packaging substrate assembly includes a second set of at least one electronic component having an access side, wherein in the oriented position, the access sides of each electronic component of the second set face in a direction orthogonal from and away from the first major side;
   after the positioning, forming an encapsulated panel that includes the first set and the second set, wherein in the encapsulated panel, the first packaging substrate assembly and the second packaging substrate assembly are in the oriented position, for each electronic component of the first set, for at least two sides of the electronic component, encapsulant of the encapsulated panel is located next to the side in a direction orthogonal from the side and extending out away from the electronic component from the side;
   forming an electronic component package from the encapsulated panel, wherein the electronic component package includes at least one electronic component from the first set and at least one electronic component from the second set;
   wherein the first packaging substrate includes a plurality of conductive pedestals located on the first major side, wherein an electronic component of the first set is electrically attached to a conductive pedestal of the plurality of conductive pedestals;
   wherein the first packaging substrate includes a support panel, the method further comprising:
      removing at least a majority of the support panel from the encapsulated panel after the forming the encapsulated panel, wherein at least a majority of each conductive pedestal of the plurality of conductive pedestals remain after the removing.

18. The method of claim 17 wherein the first set includes a first electronic component and a second electronic component, wherein after the removing, a conductive structure of the first electronic component is electrically attached to a conductive pedestal of the plurality of conductive pedestals and a conductive structure of the second electronic component is electrically attached to the conductive pedestal, wherein the electronic component package includes the first electronic component, the second electronic component, and the conductive pedestal.

19. A method of making an electronic component package, the method comprising:
   forming a first packaging substrate assembly, the forming the first packaging substrate assembly includes attaching a first set of at least one electronic component to a first major side of a first packaging substrate, wherein each electronic component of the first set includes an access side that faces the first major side as a result of the attaching;

after the attaching, positioning the first packaging substrate assembly with respect to a second packaging substrate assembly in an oriented position, wherein in the oriented position, the first major side faces towards the second packaging substrate assembly, wherein the second packaging substrate assembly includes a second set of at least one electronic component having an access side, wherein in the oriented position, the access sides of each electronic component of the second set face in a direction orthogonal from and away from the first major side;

after the positioning, forming an encapsulated panel that includes the first set and the second set, wherein in the encapsulated panel, the first packaging substrate assembly and the second packaging substrate assembly are in the oriented position, for each electronic component of the first set, for at least two sides of the electronic component, encapsulant of the encapsulated panel is located next to the side in a direction orthogonal from the side and extending out away from the electronic component from the side;

forming an electronic component package from the encapsulated panel, wherein the electronic component package includes at least one electronic component from the first set and at least one electronic component from the second set;

wherein the first packaging substrate includes a plurality of conductive pedestals located on the first major side, wherein an electronic component of the first set is electrically attached to a conductive pedestal of the plurality of conductive pedestals;

wherein the first packaging substrate includes a base structure, the plurality of conductive pedestals are made from a conductive material applied to the base structure, the base structure being of a material different than the conductive material.

20. A method of making an electronic component package, the method comprising:

forming a first packaging substrate assembly, the forming the first packaging substrate assembly includes attaching a first set of at least one electronic component to a first major side of a first packaging substrate, wherein each electronic component of the first set includes an access side that faces the first major side as a result of the attaching;

after the attaching, positioning the first packaging substrate assembly with respect to a second packaging substrate assembly in an oriented position, wherein in the oriented position, the first major side faces towards the second packaging substrate assembly, wherein the second packaging substrate assembly includes a second set of at least one electronic component having an access side, wherein in the oriented position, the access sides of each electronic component of the second set face in a direction orthogonal from and away from the first major side;

after the positioning, forming an encapsulated panel that includes the first set and the second set, wherein in the encapsulated panel, the first packaging substrate assembly and the second packaging substrate assembly are in the oriented position, for each electronic component of the first set, for at least two sides of the electronic component, encapsulant of the encapsulated panel is located next to the side in a direction orthogonal from the side and extending out away from the electronic component from the side;

forming an electronic component package from the encapsulated panel, wherein the electronic component package includes at least one electronic component from the first set and at least one electronic component from the second set;

wherein the second packaging substrate assembly includes a semiconductor wafer that includes the second set of electronic components which are unsingulated in the semiconductor wafer, wherein in the oriented position, a back side of the semiconductor wafer faces the first major side.

21. A method of making an electronic component package, the method comprising:

forming a first packaging substrate assembly, the forming the first packaging substrate assembly includes attaching a first set of at least one electronic component to a first major side of a first packaging substrate, wherein each electronic component of the first set includes an access side that faces the first major side as a result of the attaching;

after the attaching, positioning the first packaging substrate assembly with respect to a second packaging substrate assembly in an oriented position, wherein in the oriented position, the first major side faces towards the second packaging substrate assembly, wherein the second packaging substrate assembly includes a second set of at least one electronic component having an access side, wherein in the oriented position, the access sides of each electronic component of the second set face in a direction orthogonal from and away from the first major side;

after the positioning, forming an encapsulated panel that includes the first set and the second set, wherein in the encapsulated panel, the first packaging substrate assembly and the second packaging substrate assembly are in the oriented position, for each electronic component of the first set, for at least two sides of the electronic component, encapsulant of the encapsulated panel is located next to the side in a direction orthogonal from the side and extending out away from the electronic component from the side;

forming an electronic component package from the encapsulated panel, wherein the electronic component package includes at least one electronic component from the first set and at least one electronic component from the second set;

wherein the first packaging substrate includes a heatsink located on the first major side, wherein the electronic component package includes the heatsink extending in a direction towards and is thermally coupled to a surface of an electronic component of the second set, wherein the direction is orthogonal to the first major side.

22. A method of making an electronic component package, the method comprising:

attaching a first set of at least one electronic component to a first major side of a first packaging substrate;

attaching at a second set of at least one electronic component to a first major side of a second packaging substrate;

after the attaching the first set and after the attaching the second set, positioning the first packaging substrate with respect to the second packaging substrate in an oriented position such that the first major side of the first packaging substrate is facing the first major side of the second packaging substrate, wherein in the oriented position, a plurality of standoff structures separates the first packaging substrate from the second packaging substrate, each of the plurality of standoff structures includes conductive material, wherein at least a portion of each standoff structure of the plurality of standoff structures is integrally formed with the first packaging substrate;

after the positioning, forming an encapsulated panel that includes the first set, the second set, and the plurality of standoff structures, wherein in the encapsulated panel, the first packaging substrate and the second packaging substrate are in the oriented position, for each electronic component of the first set and each electronic component of the second set, for at least two sides of the electronic component, encapsulant of the encapsulated panel is located next to the side in a direction orthogonal from the side and extending out away from the electronic component from the side;

forming an electronic component package from the encapsulated panel, wherein the electronic component package includes at least one electronic component from the first set, at least one electronic component from the second set, and at least one standoff structure of the plurality of standoff structures.

* * * * *